United States Patent
Huisinga et al.

(10) Patent No.: US 8,598,714 B2
(45) Date of Patent: Dec. 3, 2013

(54) SEMICONDUCTOR DEVICE COMPRISING THROUGH HOLE VIAS HAVING A STRESS RELAXATION MECHANISM

(75) Inventors: Torsten Huisinga, Dresden (DE); Michael Grillberger, Radebeul (DE); Jens Hahn, Dresden (DE)

(73) Assignee: GLOBALFOUNDRIES Inc., Grand Cayman (KY)

(*) Notice: Subject to any disclaimer, the term of this patent is extended or adjusted under 35 U.S.C. 154(b) by 185 days.

(21) Appl. No.: 12/970,553

(22) Filed: Dec. 16, 2010

(65) Prior Publication Data
US 2012/0001330 A1 Jan. 5, 2012

(30) Foreign Application Priority Data
Jun. 30, 2010 (DE) .......................... 10 2010 030 760

(51) Int. Cl.
*H01L 23/48* (2006.01)
(52) U.S. Cl.
USPC ........................................................ 257/774
(58) Field of Classification Search
USPC ................... 438/37, 687, 688, 618–629, 637; 257/751, 774, 775, E23.145
See application file for complete search history.

(56) References Cited

U.S. PATENT DOCUMENTS

| 6,908,856 | B2 * | 6/2005 | Beyne et al. ................. 438/667 |
| 7,915,659 | B2 * | 3/2011 | Juengling ..................... 257/308 |
| 2005/0090097 | A1 * | 4/2005 | Zhang et al. ................. 438/637 |
| 2005/0121768 | A1 | 6/2005 | Edelstein et al. ............. 257/698 |
| 2005/0136686 | A1 * | 6/2005 | Kim et al. ..................... 438/778 |
| 2008/0164573 | A1 * | 7/2008 | Basker et al. ................. 257/621 |

FOREIGN PATENT DOCUMENTS

| DE | 112006001588 T5 | 5/2008 | ............ H01L 21/768 |
| JP | 06310655 A | 11/1994 | ............ H01L 27/04 |

OTHER PUBLICATIONS

Translation of Official Communication from German Patent Office for German Patent Application No. 10 2010 030 760.2 dated Feb. 16, 2011.

\* cited by examiner

*Primary Examiner* — Brook Kebede
(74) *Attorney, Agent, or Firm* — Williams, Morgan & Amerson, P.C.

(57) ABSTRACT

In a semiconductor device, through hole vias or through silicon vias (TSV) may be formed so as to include an efficient stress relaxation mechanism, for instance provided on the basis of a stress relaxation layer, in order to reduce or compensate for stress forces caused by a pronounced change in volume of the conductive fill materials of the through hole vias. In this manner, the high risk of creating cracks and delamination events in conventional semiconductor devices may be significantly reduced.

21 Claims, 5 Drawing Sheets

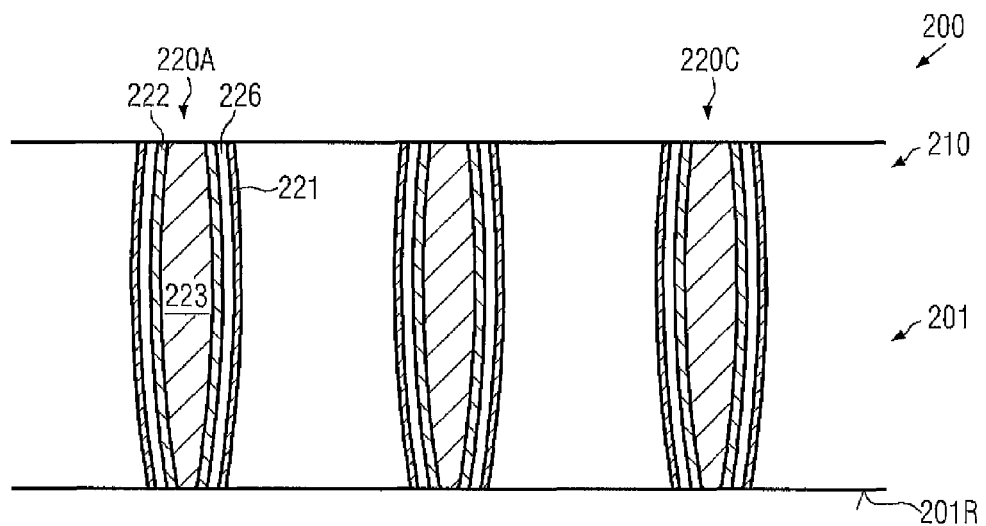
FIG. 2c
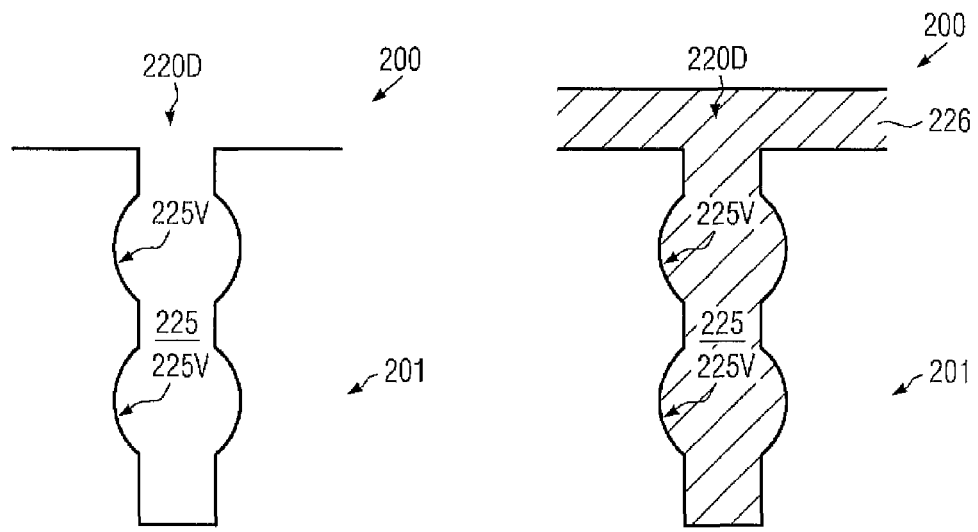
FIG. 2d
FIG. 2e

SEMICONDUCTOR DEVICE COMPRISING THROUGH HOLE VIAS HAVING A STRESS RELAXATION MECHANISM

BACKGROUND OF THE INVENTION

1. Field of the Invention

The present disclosure generally relates to the field of fabricating integrated circuits, and, more particularly, to interconnect structures for connecting different device levels by vias extending through the substrate material of the devices.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are reduced with the introduction of every new circuit generation, to provide currently available integrated circuits formed by volume production techniques with critical dimensions of 50 nm or less and having an improved degree of performance in terms of speed and/or power consumption. A reduction in size of transistors is an important aspect in steadily improving device performance of complex integrated circuits, such as CPUs. The reduction in size is commonly associated with an increased switching speed, thereby enhancing signal processing performance at transistor level.

In addition to the large number of transistor elements, a plurality of passive circuit elements, such as capacitors, resistors, interconnect structures and the like, are typically formed in integrated circuits as required by the basic circuit layout. Due to the decreased dimensions of the active circuit elements, not only the performance of the individual transistor elements may be improved, but also their packing density may be increased, thereby providing the potential for incorporating more and more functions into a given chip area. For this reason, highly complex circuits have been developed, which may include different types of circuits, such as analog circuits, digital circuits and the like, thereby providing entire systems on a single chip (SoC).

Although transistor elements are the dominant circuit elements in highly complex integrated circuits which substantially determine the overall performance of these devices, other components such as capacitors and resistors, and in particular a complex interconnect system or metallization system, may be required, wherein the size of these passive circuit elements may also have to be adjusted with respect to the scaling of the transistor elements in order to not unduly consume valuable chip area.

Typically, as the number of circuit elements, such as transistors and the like, per unit area increases in the device level of a corresponding semiconductor device, the number of electrical connections associated with the circuit elements in the device level is also increased, typically even in an over-proportional manner, thereby requiring complex interconnect structures which may be provided in the form of metallization systems including a plurality of stacked metallization layers. In these metallization layers, metal lines, providing the inner level electrical connection, and vias, providing intra level connections, may be formed on the basis of highly conductive metals, such as copper and the like, in combination with appropriate dielectric materials so as to reduce the parasitic RC (resistive capacitive) time constants, since, in sophisticated semiconductor devices, typically, signal propagation delay may be substantially restricted by the metallization system rather than the transistor elements in the device level.

However, expanding the metallization system in the height dimension so as to provide the desired density of interconnect structures may be restricted by the parasitic RC time constants and the limitations imposed by the material characteristics of sophisticated low-k dielectrics. That is, typically, a reduced dielectric constant is associated with reduced mechanical stability of these dielectric materials, thereby also restricting the number of metallization layers that may be stacked on top of each other in view of yield losses during the various fabrication steps and the reduced reliability during operation of the semiconductor device. Thus, the complexity of semiconductor devices provided in a single semiconductor chip may be restricted by the capabilities of the corresponding metallization system and in particular by the characteristics of sophisticated low-k dielectric materials, since the number of metallization layers may not be arbitrarily increased.

For this reason, it has also been proposed to further enhance the overall density of circuit elements for a given size or area of a respective package by stacking two or more individual semiconductor chips, which may be fabricated in an independent manner, however, with a correlated design so as to provide, in total, a complex system while avoiding many of the problems encountered during the fabrication process for extremely complex semiconductor devices on a single chip. For example, appropriately selected functional units, such as memory areas and the like, may be formed on a single chip in accordance with well-established manufacturing techniques including the fabrication of a corresponding metallization system, while other functional units such as a fast and powerful logic circuitry may be formed independently as a separate chip, wherein, however, respective interconnect systems may enable a subsequent stacking and attaching of the individual chips so as to form an overall functional circuit, which may then be packaged as a single unit. Thus, a corresponding three-dimensional configuration may provide increased density of circuit elements and metallization features with respect to a given area of a package, since a significant larger amount of the available volume in a package may be used by stacking individual semiconductor chips. Although this technique represents a promising approach for enhancing volume packing density and functionality for a given package size for a given technology standard while avoiding extremely critical manufacturing techniques, for instance in view of stacking a large number of highly critical metallization layers, appropriate contact elements have to be provided to enable the electrical connections of the individual semiconductor chips in a reliable and well-performing manner. To this end, it has been suggested to form through hole vias through the substrate material of at least one of the chips so as to enable electrical contact to respective contact elements of a second semiconductor chip, while the metallization system of the first semiconductor chip may further be available for connecting to other semiconductor chips or a package substrate and the like. These through hole vias, which are also referred to as through silicon vias (TSV), may typically represent contact elements of a high aspect ratio, since the lateral dimensions of these vias may also be reduced in view of saving valuable chip area, while on the other hand the thickness of the substrate material may not be arbitrarily reduced. Additionally, in view of electrical performance, the conductivity of the through hole vias should be maintained at a high level so as to accommodate the required high current densities and also reduce signal propagation delay in systems in which exchange of electrical signals between individual semiconductor chips may have to be accomplished on the basis of moderately high clock frequencies.

In view of this situation, in conventional approaches, the corresponding high aspect through hole vias may be formed on the basis of well-established manufacturing techniques also known from the fabrication of contact structures and metallization systems, which may involve the etching of respective openings, such as via openings and trenches in a moderately thin dielectric material and the subsequent filling of these openings with metal-containing materials, such as copper in combination with conductive barrier materials, such as titanium nitride, tantalum nitride, tantalum and the like. By transferring a corresponding technology to a fabrication sequence for through hole vias, appropriate high conductivity values may be obtained in conformity with requirements with respect to enhanced electrical performance.

Consequently, a plurality of process strategies have been developed in which deep openings are formed in the silicon substrate at any appropriate manufacturing stage and wherein these openings are then filled with materials as are typically used for forming the metallization system of the semiconductor device under consideration. For example, via holes may be formed in the front side of the silicon substrate or the via holes may be formed in any appropriate metallization layer so as to extend deeply into the silicon substrate, wherein the via holes may be opened from the rear side of the substrate prior to or after filling in appropriate metal-containing materials, such as conductive barrier layers in combination with copper and the like. In other cases, the through hole vias may be formed from the rear side of the substrate at any appropriate manufacturing stage that is compatible with the overall manufacturing flow for forming circuit elements and the like. Consequently, the through hole vias may provide superior connectivity between critical circuit portions, which may be efficiently formed on different device levels or different semiconductor chips, which may be efficiently stacked on top of each other, wherein the substantially vertical connection may provide reduced parasitic capacitance and resistance. Furthermore, increased volume packing density may be accomplished for a given lateral area of a package so that very complex electronic systems may be integrated into a single package, while at the same time complexity of individual circuit portions or device portions, such as metallization systems and the like, may be reduced.

Although the three-dimensional stacking of device levels or semiconductor chips is a very promising approach for enhancing performance of complex integrated circuits, however, the thermal mismatch in the coefficient of thermal expansion between the through hole vias and the silicon substrate may result in severe damage and thus failures of complex semiconductor devices, as will be described in more detail with reference to FIG. 1.

FIG. 1 schematically illustrates a cross-sectional view of a semiconductor device 100, which may represent a part of a complex integrated circuit to be provided as a three-dimensional stacked configuration. The semiconductor device 100 comprises a substrate 101, such as a silicon substrate, since presently complex semiconductor devices are being made and will be made in the near future on the basis of a silicon material. The silicon substrate 101 has a rear side 101R, which is to be contacted with a further semiconductor device, a carrier substrate and the like, in order to provide a stacked device configuration. Furthermore, the substrate 101 comprises a front side 101F above which is typically provided a semiconductor layer, such as a silicon layer 102, in and above which are typically provided circuit elements 103, such as transistors and the like. It should be appreciated, however, that circuit elements, such as capacitors and the like, may also be frequently provided within the substrate 101, that is, at or near the front side 101F. For convenience, any such circuit elements formed within the substrate 101 are not shown in FIG. 1. It should further be noted that the circuit elements 103 may be formed on the basis of critical dimensions of 50 nm and even less, when sophisticated devices such as CPUs, advanced memory devices and the like are considered. Furthermore, the semiconductor device 100 may comprise a metallization system 110, which is to be understood as one or more metallization layers in which metal lines are provided to establish the electrical connections between the individual circuit elements 103 in accordance with the circuit layout under consideration. Typically, as discussed above, a plurality of metallization layers 111, 112 and 113 are necessary to establish the required electrical connection. For convenience, any specific configuration of these metallization layers is not shown in FIG. 1 and significantly depends on the overall device requirements. For example, in sophisticated applications, highly conductive metals such as copper and the like are used as metal, in combination with conductive barrier material systems such as tantalum, tantalum nitride, titanium, titanium nitride and the like. Furthermore, complex dielectric materials such as ULK materials and low-k dielectric materials are frequently used to enhance the overall performance of the metallization system 110. Furthermore, the semiconductor device 100 comprises through hole vias 120A, 120B, which may also be referred to as through silicon vias (TSV), which, in the manufacturing stage shown, may extend through at least a portion of the metallization system 110, through the semiconductor layer 102 and deeply into the substrate 101. For example, in the process strategy as illustrated in FIG. 1, the through hole vias 120A, 120B may connect to the rear side 101R by removing a portion of the substrate 101 so as to finally expose a portion of the through hole vias 120A, 120B, as is indicated by the dashed line in FIG. 1. As discussed above, however, any other process strategy may be applied wherein the through hole vias 120A, 120B may have basically the same configuration. In the example shown, the vias 120A, 120B may comprise an insulating material layer 121, such as a silicon dioxide material and the like, which may separate a conductive fill material from the material of the substrate 101 in order to reliably electrically isolate the vias 120A, 120B. In the example shown, a conductive barrier material 122, such as a material system comprised of tantalum and tantalum nitride, may be provided in combination with a highly conductive core metal 123, such as copper, when these materials are also used in the metallization system 110.

The semiconductor device 100 as illustrated in FIG. 1 may be formed on the basis of any appropriate process strategy. For example, the circuit elements 103 may be formed in and above the silicon layer 102 in accordance with well-established process strategies in order to obtain the circuit elements based on the design rules for the device 100. Thereafter, the metallization system 110 may be formed by forming the metallization layers 111, 112 based on the deposition of sophisticated dielectric materials and patterning the same so as to form corresponding lines and via openings therein, which are subsequently filled with appropriate conductive materials, such as tantalum, tantalum nitride, copper and the like. At any appropriate stage, also openings for the through hole vias 120A, 120B may be formed through the metallization system 110 and these openings may be formed so as to extend through the layer 102 and into the substrate 101, as illustrated in FIG. 1. It should be appreciated that, during a corresponding complex etch process, other device areas may be efficiently masked by polymer materials such as resist materials and the like. Furthermore, a plurality of well-established etch recipes are available in order to form openings into the substrate 101 having any appropriate shape and lateral size, depending on the requirements for the through hole vias 120A, 120B. For example, the corresponding holes may be formed with a lateral size of 15-20 µm or greater, wherein the lateral size may vary with the depth of the corresponding via holes. As discussed above, the via holes may be formed so as to extend to a certain depth, wherein the bottom of the through hole vias 120A, 120B may be exposed by removing material from the rear side 101R at any later manufacturing stage, wherein also an appropriate metallization system may be provided at the rear side 101R after the material removal in order to appropriately connect to the through hole vias 120A, 120B and to provide an appropriate bump structure so as to contact a further contact structure of a semiconductor device, a carrier substrate and the like. After forming the deep via holes, insulating material 121 is typically provided, for instance by appropriate deposition processes, followed by the deposition of the conductive barrier material 122 and the highly conductive core metal 123, which may be accomplished by applying well-established deposition techniques, such as chemical vapor deposition (CVD) for the layer 121, CVD or sputter deposition for the layer or layer system 122 and electrochemical deposition techniques for the core material 123. It should be appreciated that, if required, an additional seed layer, such as a copper layer, may be provided after the deposition of the conductive barrier material 122, which may also be accomplished on the basis of sputter deposition, electrochemical deposition and the like. In particular during the deposition of the core metal 123, an efficient bottom-to-top fill behavior is accomplished on the basis of pulse reverse regimes used during an electroplating process, thereby substantially void-free filling in the core metal 123. Thereafter, any excess material may be efficiently removed, for instance by chemical mechanical polishing (CMP), electro etching and the like. Thereafter, any further metallization layers, such as the layer 113, may be provided so as to appropriately contact the through hole vias 120A, 120B and also other components of the metallization system 110.

During the further processing and also during operation of the semiconductor device 100, once it may be incorporated in a three-dimensional stacked device configuration, the mismatch of the coefficients of thermal expansion of the through hole vias 120A, 120B and the substrate 101 may result in device failures, for instance caused in the metallization system 110 and/or in the device level 102, that is, in the vicinity of the front side 101F of the substrate 101. As is well known, the coefficient of thermal expansion of metals, such as copper, is several times greater than the thermal expansion coefficient of, for instance, silicon material, which may thus result in severe thermally induced stress caused by the different change in volume of the through hole vias 120A, 120B with respect to the substrate material 101. For example, as indicated by 123V, a significant increase in volume may occur upon elevated temperatures which may be induced during the further processing of the device 100 and/or during operation of the device 100, thereby resulting in significant mechanical stress, since the core metal 123 may be efficiently coupled to the surrounding materials by means of the barrier material system 122. For example, upon expanding in a vertical direction, severe damage may occur in the metallization system 110, as indicated by 110S, thereby even initiating a certain degree of lift-off of one or more of the metallization layers, such as the metallization layer 113. In other cases, in addition to the damage 110S, significant stress components may be exerted to the substrate 101 and also to the device level 102, which may cause cracks and material delamination events, indicated as 102S, which may also contribute to significant device failures in the circuit elements 103, which may comprise highly sophisticated components formed on the basis of critical dimensions of 50 nm and significantly less. It should be appreciated that similar stress conditions may also be induced in cold temperature environments, wherein the shrinkage of the conductive core metal 123 may be significantly greater compared to the substrate material 101, thereby significantly restricting the applicability of the semiconductor device 100 in terms of sophisticated environmental conditions.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which through hole vias may be provided so as to provide superior connectivity of complex semiconductor devices, for instance in terms of forming a three-dimensional stacked device configuration and the like, wherein thermally induced stress forces may be reduced. To this end, a stress relaxation mechanism may be provided in or in the vicinity of the through hole vias in order to accommodate at least a significant portion of the mechanical stress that may be caused by the difference in the coefficient of thermal expansion between the through hole vias or any conductive materials provided therein and the substrate material of the semiconductor device, such as a silicon material and the like. In some illustrative embodiments disclosed herein, the stress relaxation mechanism may be based on the provision of an appropriately selected material that may be formed in the via hole so as to act as an efficient buffer material in order to "accommodate" a certain part of the pronounced change in volume of the conductive materials of the through hole via, thereby reducing the mechanical stress forces induced in the surrounding substrate material. Furthermore, the stress relaxation mechanism may additionally or alternatively comprise appropriately positioned volume expansion areas, which may allow significant expansion of materials upon a temperature increase, substantially without affecting the surrounding substrate material. The volume expansion areas may be positioned within or outside the through hole vias. Consequently, highly conductive through hole vias may be provided on the basis of any appropriate material system including highly conductive metals, such as copper and the like, wherein also efficient barrier material systems may be applied, while any undue thermally induced stress forces may be reduced, thereby reducing the probability of creating cracks and delamination events in the metallization system and/or the device level of sophisticated semiconductor devices.

One illustrative semiconductor device disclosed herein comprises a substrate having a front side and a rear side. The semiconductor device further comprises a through hole via formed in the substrate so as to extend at least to the rear side, wherein the through hole via comprises a dielectric layer formed in contact with the substrate and comprising a metal-containing conductive fill material. Furthermore, the semiconductor device comprises a stress relaxation mechanism formed in contact with the through hole via and configured to reduce thermally induced stress caused by a mismatch of coefficients of thermal expansion between the substrate and the conductive fill material.

One illustrative method disclosed herein relates to forming a through hole via in a semiconductor device. The method comprises forming an opening in a substrate of the semiconductor device and forming a stress relaxation layer above sidewalls of the opening of the through hole via. Moreover, the method comprises forming a metal-containing material in the opening after forming the stress relaxation layer.

A further illustrative method disclosed herein comprises forming a through hole via in a substrate of a semiconductor device, wherein the through hole via comprises a fill metal. The method further comprises forming a stress relaxation mechanism operatively connected to the through hole via, wherein the stress relaxation mechanism reduces a thermally induced stress in the semiconductor device that is caused by a mismatch of coefficients of thermal expansion of the substrate and the fill metal.

BRIEF DESCRIPTION OF THE DRAWINGS

The disclosure may be understood by reference to the following description taken in conjunction with the accompanying drawings, in which like reference numerals identify like elements, and in which:

FIGS. 2a-2c schematically illustrate cross-sectional views of a semiconductor device during various manufacturing stages in forming through hole vias having additional stress relaxation capabilities provided on the basis of a stress relaxation layer, according to illustrative embodiments;

FIGS. 2d-2g schematically illustrate cross-sectional views of the semiconductor device according to still further illustrative embodiments in which volume expansion areas may be provided within the through hole vias so as to even further enhance the stress relaxation capabilities;

Figure 1:
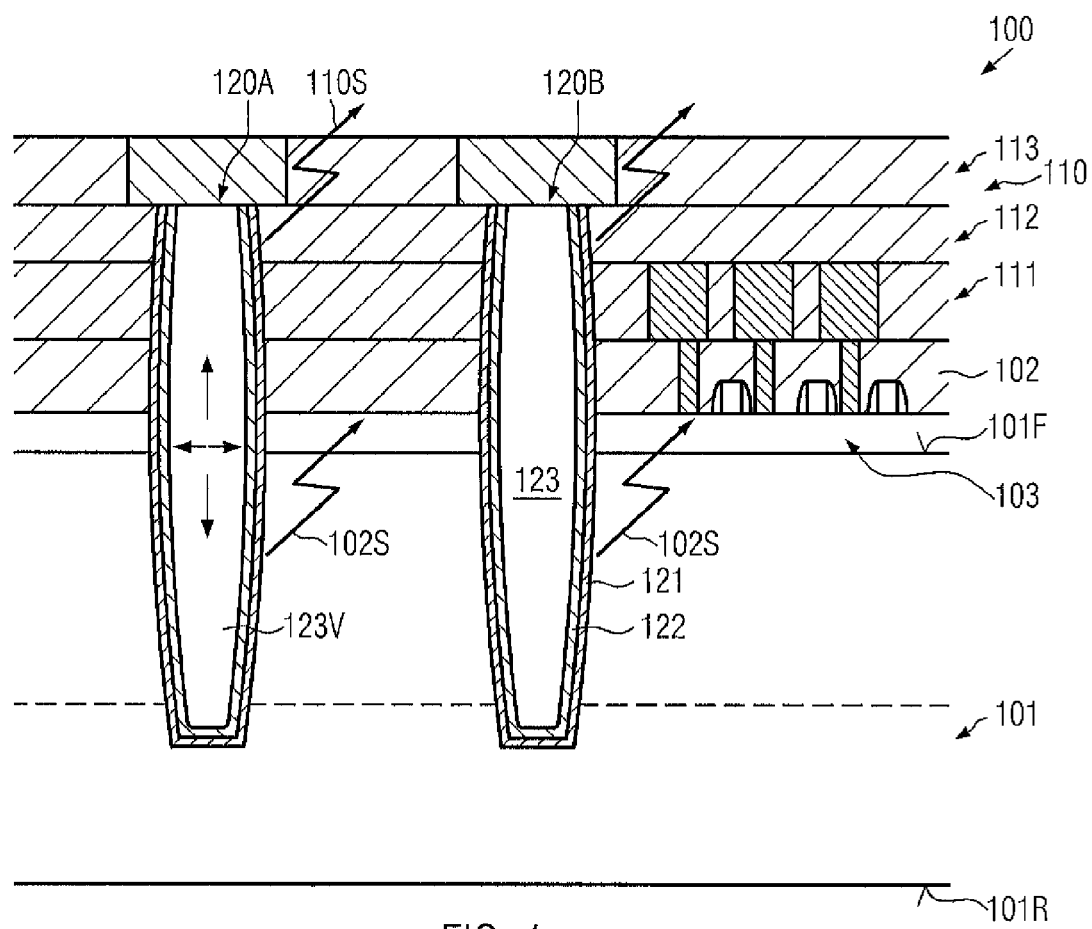
FIG. 1 schematically illustrates a cross-sectional view of a semiconductor device comprising through hole vias in an intermediate manufacturing stage formed on the basis of a conventional process strategy.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides semiconductor devices and manufacturing techniques which address the problem of increased device failures in complex semiconductor devices comprising through hole vias formed on the basis of highly conductive material having a significantly different coefficient of thermal expansion compared to other well-established materials used in the fabrication of complex semiconductor devices, such as silicon, silicon dioxide and the like. To this end, a stress relaxation mechanism may be implemented in the semiconductor device so as to be operatively connected to the through hole vias in the sense that at least a part of a change in volume caused by a change in temperature may be accommodated by the stress relaxation mechanism in such as way that the resulting stress forces are reduced compared to conventional configurations, as are described for instance with reference to FIG. 1. In some illustrative embodiments disclosed herein, the stress relaxation mechanism may be implemented on the basis of a stress relaxation layer which may be formed in the opening of the through hole via prior to the deposition of the metal-containing fill materials. The stress relaxation layer may be considered as an appropriate buffer material that may be in mechanical contact with a metal-containing fill material and thus may be deformed upon a significant change in volume of the metal-containing fill material. On the other hand, the buffer material may also be in mechanical contact with the substrate, for instance via an insulating material, wherein the response of the buffer material to a significant change in volume of the fill material may result in a reduced mechanical response and interaction with the surrounding substrate, thereby providing a stress relaxing effect. To this end, the buffer layer may be comprised of any appropriate material and may be provided with an appropriate layer thickness so as to obtain the stress relaxing effect, wherein, if appropriate, the buffer material may also provide dielectric separation, which may allow omitting a conventional dielectric material, such as silicon dioxide. In some illustrative embodiments, the stress relaxation layer or buffer layer may be provided in the form of a material, which may be referred to as a resilient material compared to the substrate material and the conductive fill material of the through hole via, wherein the term resilient may be quantitatively determined by a hardness that is at least fifty percent less than a hardness of at least the core metal of the through hole via. It should be appreciated that the hardness may be determined on the basis of any well-established measurement strategies for any given material composition, for instance by forming any test substrates having formed thereon the materials under consideration. For example, resilient materials may be provided in the form of polymer materials, which typically may have a significantly reduced mechanical strength, however, with a significantly reduced tendency of forming cracks compared to a plurality of conventionally used material or material systems of semiconductor devices. For example, the mechanical characteristics of polymer materials may be adjusted on the basis of incorporating specific components and also selecting process conditions for treating polymer materials after applying these materials on appropriate surface areas in a semiconductor device.

In other illustrative embodiments disclosed herein, the stress relaxation mechanism may comprise, in addition to or alternatively to a buffer material, appropriately designed volume expansion areas which may be understood as areas operatively connected to the through hole via in order to allow the accommodation of any material upon a pronounced increase of volume caused by an increase in temperature. For example, in combination with a highly deformable buffer material, the volume expansion area may enable an efficient displacement of the buffer material into the volume expansion area, thereby further reducing the finally induced stress in the neighborhood of the through hole via. In some illustrative embodiments, the volume expansion area may be provided as a substantially non-filled area that is appropriately positioned in the vicinity of the through hole via, thereby forming an efficient stress buffer upon a change in volume of one or more of the materials within the through hole via. To this end, one or more auxiliary openings may be formed in close proximity to the actual through hole via, wherein the auxiliary opening or openings may be filled with a highly resilient material or may remain substantially non-filled, which may be accomplished by selecting an appropriate geometry of the auxiliary opening(s).

Consequently, by implementing the stress relaxation mechanism in combination with the through hole via, highly efficient material systems, such as well-established barrier layers in combination with highly conductive metals, may be provided in the through hole vias, while at the same time efficiently reducing the probability of creating any device failures in the semiconductor device.

With reference to FIGS. 2a-2j, further illustrative embodiments will now be described in more detail, wherein reference may also be made to FIG. 1, if appropriate.

Figure 2A:
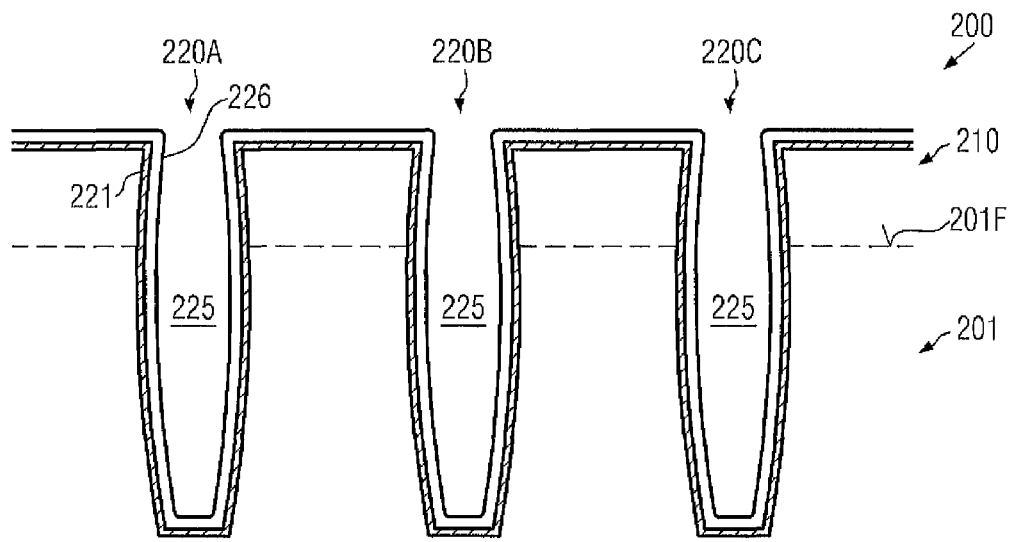

FIG. 2a schematically illustrates a cross-sectional view of a semiconductor device 200 in a manufacturing stage in which through hole vias are to be formed at least in a significant portion of a substrate 201 of the device 200. As illustrated, the substrate 201, which may be provided in the form of a silicon substrate, a silicon-on-insulator (SOI) substrate, or any other appropriate carrier material for forming therein and thereabove circuit elements, such as transistors and the like, may have a rear side 201R and a front side 201F, wherein further device and metal levels may be formed in and above the front side 201F. For convenience, any such further device levels are indicated by 210, however, without illustrating any specific components. For example, as previously explained with reference to the semiconductor device 100, the device and/or metallization levels 210 may comprise appropriate semiconductor materials for forming therein and thereabove circuit elements, such as transistors and the like, while also one or more metallization layers may be provided in the device and/or metallization levels 210 as is also previously discussed. Furthermore in the manufacturing stage shown, through hole vias 220A, 220B, 220C may be provided in the appropriate area of the semiconductor device 200 in accordance with the overall device layout so as to enable a connection to other semiconductor devices, carrier substrates and the like. In the embodiment shown, corresponding via holes 225 may extend deeply into the substrate 201 and may be formed on the front side 201F, for instance through the levels 210, as is also previously explained with reference to the semiconductor device 100. It should be appreciated however that the via holes 225 may be formed in the front side 201F without providing any metallization levels, if considered appropriate, and a second part of the via holes 225 may be provided in a later manufacturing stage, i.e., after forming one or more further levels 210, wherein the previously formed part of the via holes 225 may be filled with any sacrificial material. In other cases, as is also previously discussed, the via holes 225 may be formed from the rear side 201R so as to extend into and through the substrate 201. It should be appreciated that the principles disclosed herein may be applied to any appropriate process strategy for forming the through hole vias 220A, 220B, 220C and thus the scope of the disclosure should not be considered as being restricted to any specific reference to a process strategy unless such specific strategies are referred to in specific embodiments and/or in the appended claims.

Furthermore, in the manufacturing stage shown, the via holes 225 may be coated with an insulating material 221, such as silicon dioxide and the like, having any appropriate layer thickness and material composition so as to comply with the device requirements. Moreover, a stress relaxation layer or buffer layer 226 may be formed within the via holes 225, wherein the layer 226 may have an appropriate thickness and material composition so as to act as a stress buffer material, as explained above. That is, the layer 226 may be in contact with the substrate 201 and also with any materials of the levels 210, if provided in this manufacturing stage, for instance via the insulating material 221 so as to reduce the effect of a difference in volume change upon temperature variations between the material of the substrate 201 and any other materials of the levels 210 and a conductive fill material or materials still to be provided within the via holes 225. To this end, the stress relaxation layer 226 may be provided with a thickness of several hundred nanometers to approximately one micrometer or more with an appropriate material composition so as to respond to the difference in volume change without producing undue stress forces in the neighborhood of through hole vias 220A, 220B, 220C. For example, the material 226 may be comprised of a resilient material in the above-defined sense, for instance provided in the form of a polymer material, which may represent a highly deformable material, which may thus respond in a resilient manner to significant volume changes of a conductive fill material in the via holes 225. In other embodiments, the layer 226 may comprise a very stiff material, such as silicon nitride, in order to efficiently confine a fill metal in combination with an appropriately selected resilient material. In such embodiments, for instance, the insulating material 221 may be provided in the form of a very stiff material, for instance by using silicon nitride, which may also provide the possibility of omitting sophisticated barrier material systems, since silicon nitride may provide superior copper diffusion blocking capabilities.

The semiconductor device 200 as shown in FIG. 2a may be formed on the basis of the following processes. Generally, the device and/or metallization levels 210 may be formed in accordance with any appropriate process strategy, as is also discussed above, and the via holes 225 may be formed by appropriately masking the device 200 and applying any appropriate etch strategy, as discussed above. Thereafter, the insulating material 221, if required, may be deposited, for instance, by CVD, followed by the deposition of the stress relaxation layer 226, which may be accomplished on the basis of any appropriate deposition technique, such as CVD and the like. It should be appreciated that the material 226 may also be provided in a state of low viscosity, as will be described later on in more detail.

Figure 2B:
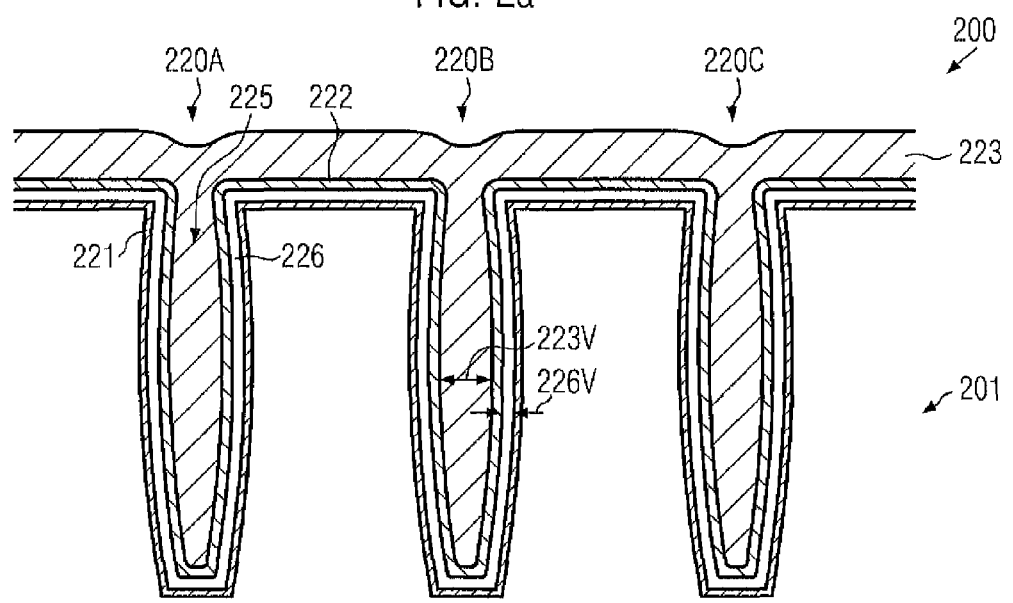

FIG. 2b schematically illustrates the semiconductor device 200 in a further advanced manufacturing stage. As illustrated, a barrier layer or layer system 222 may be provided in combination with a conductive core metal 223, for instance in the form of aluminum, copper and the like, wherein the materials 222 and 223 may be commonly referred to as conductive metal-containing fill materials. The layers 222 and 223 may be formed on the basis of any appropriate deposition technique, such as sputter deposition, electrochemical deposition and the like, as is also previously explained with reference to the semiconductor device 100. For example, the barrier system 222 may provide sufficient adhesion to the stress relaxation layer 226, which may comprise a resilient material and the like, as previously explained, in order to act as a volume accommodation or buffer area to any change in volume, as indicated by 223V. That is, the material 226 may accommodate at least a certain portion of an increase in volume upon elevated temperatures applied in the device 200, for instance during the further processing or during operation of the device 200, as is indicated by 226V. Consequently, reduced mechanical stresses may be induced in the neighborhood of the through hole vias 220A, 220B, 220C.

FIG. 2c schematically illustrates the semiconductor device 200 in a further advanced manufacturing stage. As illustrated, any excess portions of the materials 222, 226 and 223, possibly in combination with the insulating material 221, may be removed, while also a portion of the substrate 201 may be removed. To this end, any well-established process techniques may be applied, as is also previously discussed. Consequently, in the manufacturing stage shown, the through hole vias 220A, 220B, 220C may extend completely through the substrate 201 and may be exposed at the rear side 201R to any desired degree in order to enable to form an appropriate contact structure at the rear side 201R for connecting to other semiconductor devices, carrier substrates and the like, in order to establish a stacked device configuration, as is also previously explained.

FIG. 2d schematically illustrates the semiconductor device 200 according to further illustrative embodiments in which the via hole 225 of a through hole via 220D may be formed in such a manner that one or more volume expansion areas 225V are provided in the via hole 225. To this end, the via hole 225 may be formed on the basis of an etch strategy in which at least once a substantially isotropic etch ambient may be established during the etch process, thereby obtaining an increased lateral etch rate, which may result in the volume expansion area 225V. After the corresponding isotropic etch phase, a deposition process may be performed so as to form a liner on sidewalls of the area 225V and thereafter a further anisotropic etch step in combination with a further isotropic etch step may be performed, depending on the desired number of volume expansion areas 225V that are to be provided along the depth of the via hole 225. It should be appreciated that corresponding etch recipes are well established for a plurality of materials, such as silicon and the like, and any such etch strategy may be used for forming the via hole 225 comprising the one or more expansion areas 225V.

FIG. 2e schematically illustrates the device 200 in a further advanced manufacturing stage wherein the stress relaxation layer or buffer layer 226 may be provided so as to substantially completely fill the via hole 225 and thus also the expansion area 225V. For example, the material 226 may be provided in a low viscous state on the basis of spin-on techniques using any appropriate polymer material. Thereafter, appropriate treatments based on radiation, heat and the like may be applied so as to adjust the finally desired characteristics of the layer 226.

Figure 2F:
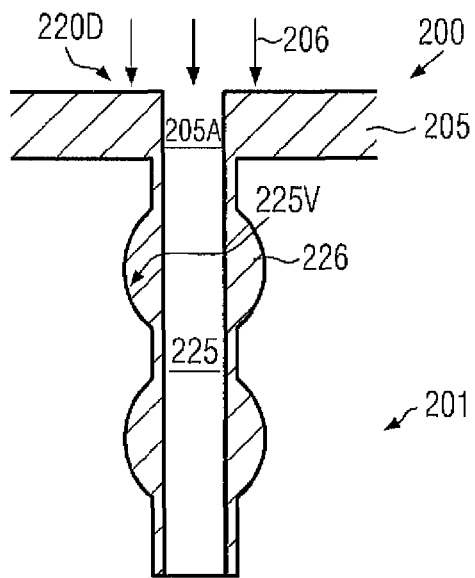

FIG. 2f schematically illustrates the semiconductor device 200 in a further advanced manufacturing stage in which an anisotropic etch process 206 may be applied on the basis of an etch mask 205, which may comprise a mask opening 205A so as to expose a portion of the via hole 225. It should be appreciated that the etch mask 205 may also be represented by the material layer 226, if provided in the form of a radiation sensitive material, which may be patterned on the basis of lithography techniques. In other cases, any excess portion of the material 226 may be removed prior to the formation of the mask 205, if considered appropriate. Thus, based on the anisotropic etch process 206, an exposed portion of the material 226 may be removed within the via hole 225, thereby preserving a residual layer, which is also indicated as 226, which may thus be formed on sidewalls of the via hole 225 and thus also within the volume expansion areas 225V.

It should be appreciated that the concept of forming the stress relaxation layer 226 in the through hole via 220D may also be applied to any other through hole vias, such as the vias 220A, 220B, 220C previously described with reference to FIGS. 2a-2c in order to form a highly resilient material layer on the basis of deposition techniques, such as spin-on techniques and the like. It should further be noted that the deposition of any additional insulating material may not be required, since, for instance, any such dielectric material may have been previously deposited in order to obtain the volume expansion area 225V, as discussed above. In other cases, a desired insulating material may be deposited prior to the deposition of the material 226, as shown in FIG. 2e, if required. In still other illustrative embodiments, the material 226 may itself provide sufficient dielectric capabilities so that any additional dedicated dielectric material may be omitted.

Figure 2G:
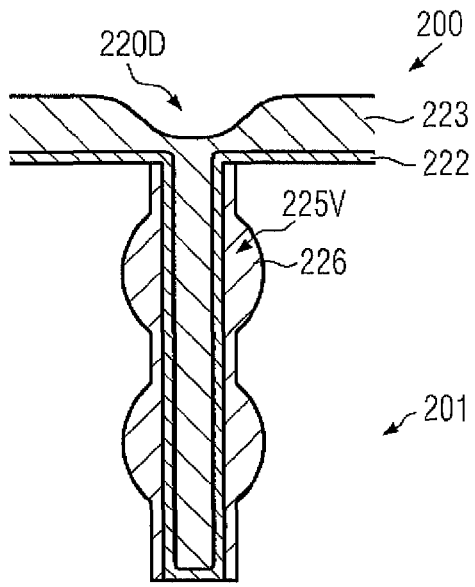

FIG. 2g schematically illustrates the semiconductor device 200 in a further advanced manufacturing stage. As illustrated, the one or more barrier layers 222 and the highly conductive core material 223 may be formed in the through hole via 220D, which may be accomplished on the basis of any appropriate process techniques as are, for instance, also described above. Consequently, due to the provision of the volume expansion areas 225V, the corresponding stress relaxation mechanism for the through hole via 220D, which may be considered as a combination of the presence of the material 226 and the expansion area 225V, may further be enhanced, since a more efficient compensation of a change in volume of the materials 222 and 223 may be possible.

Figure 2I:
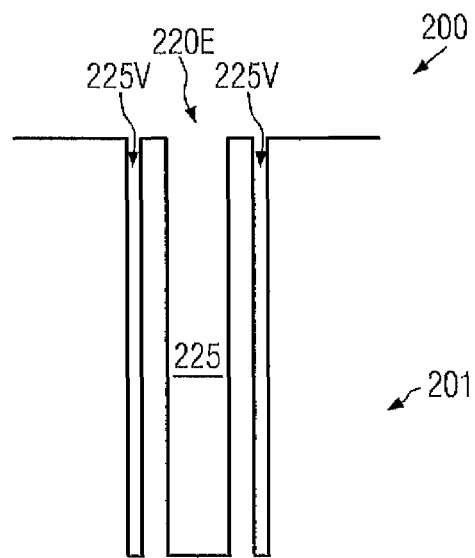
FIGS. 2i-2j schematically illustrate cross-sectional views of the device shown in FIG. 2h during various manufacturing stages according to illustrative embodiments.
Figure 2H:
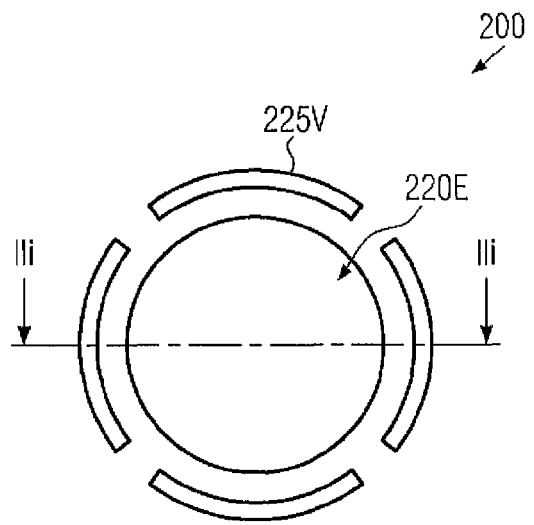
FIG. 2h schematically illustrates a top view of the semiconductor device in which a stress relaxation mechanism may be implemented on the basis of volume expansion areas provided outside of the through hole vias, according to illustrative embodiments.

FIG. 2h schematically illustrates a top view of the semiconductor device 200 according to still further illustrative embodiments wherein the stress relaxation mechanism for a through hole via 220E may be provided, in addition or alternatively to any stress relaxation materials on the basis of volume expansion areas 225V, which may be positioned outside yet in close proximity to the through hole vias 220E. To this end, the volume expansion areas 225V may be formed with a lateral distance of approximately one micrometer to several micrometers and with an appropriate size and shape and number so as to obtain the desired stress relaxing effect. For example, a plurality of split-like configurations may be provided so as to surround the through hole via 220E, wherein, however, any other geometric configurations may be applied.

FIG. 2i schematically illustrates a cross-sectional view of the device 200 along the line IIi of FIG. 2h. As illustrated, the via hole 225 may be formed in the substrate 201 and may be positioned laterally between the corresponding volume expansion areas 225V. It should be appreciated that, in some illustrative embodiments, the via hole 225 and the expansion areas 225V may be formed in a common etch process, while, in other cases, different etch steps may be applied so as to specifically adjust process parameters in order to obtain the desired cross-sectional shape and size of the openings 225 and 225V, respectively. For example, an upper portion of the expansion areas 225V may be provided with a "bottle-neck" (not shown) on the basis of a dedicated etch strategy in order to provide corresponding process conditions during the subsequent processing, for instance for depositing an insulating material.

Figure 2J:
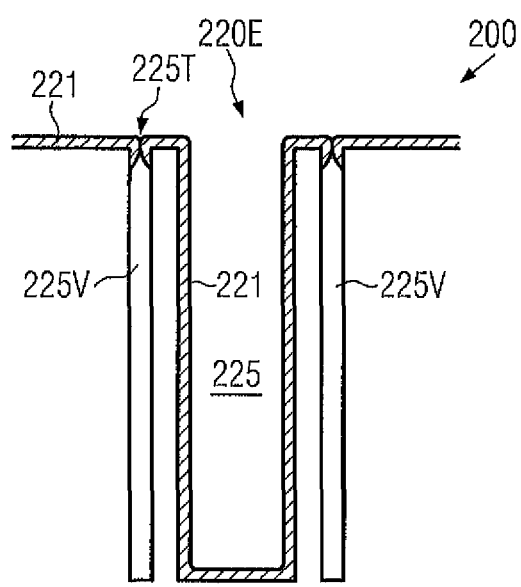

FIG. 2j schematically illustrates the semiconductor device 200 in a further advanced manufacturing stage. As illustrated, an insulating material 221, such as silicon dioxide and the like, may be deposited within the via hole 225, while a volume expansion area 225V may remain substantially non-filled, since the material 221 may substantially close a top portion 225T of the areas 225V. That is, the lateral size of at least the top portion 225T may be selected such that corresponding overhangs at the top portion 225T may result in an efficient closure of the areas 225V, thereby preserving significant "empty" volume within the areas 225V, which may thus represent an efficient stress buffer with respect to any changes in volume of a fill material within the via hole 225.

Consequently, after the deposition of the material layer 221, the further processing may be continued, for instance, by depositing any barrier materials and the conductive core metal based on process techniques, as described above. Consequently, the through hole via 220E may have an efficient stress relaxation mechanism based on the expansion areas 225V, which may comprise a non-filled interior volume. If desired, an additional stress relaxation layer may be formed within the via hole 225, as is also previously explained. Also, additional volume expansion areas may be provided within the through hole via 220E, for instance as shown in FIGS. 2d-2f, wherein, if desired, these through hole via internal expansion volumes may be in direct contact with the external expansion areas 225V as shown in FIG. 2j.

As a result, the present disclosure provides semiconductor devices and manufacturing techniques in which an efficient stress relaxation mechanism may be implemented in combination with through hole vias, for instance by providing a stress relaxation layer and/or providing volume expansion areas so that stress forces created by thermal expansion of metal-containing fill materials in the through hole vias may be efficiently reduced. The stress relaxation mechanism may be efficiently applied in the context of any process strategy for forming vertical contacts extending through a substrate of a semiconductor device in order to enable the efficient stacking of one or more semiconductor devices or any other substrates.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
a substrate having a front side and a rear side;
a through hole via formed in said substrate so as to extend at least to said rear side, said through hole via comprising a dielectric layer formed in contact with said substrate, a stress relaxation layer, and a metal-containing conductive fill material, wherein said stress relaxation layer is positioned between said dielectric layer and said metal-containing conductive fill material and is adapted to reduce thermally induced stress caused by a mismatch of coefficients of thermal expansion between said substrate and said metal-containing conductive fill material.

2. The semiconductor device of claim 1, wherein said stress relaxation layer comprises a resilient material that is configured to accommodate at least a portion of a thermally induced change of volume of said conductive fill material.

3. The semiconductor device of claim 2, wherein said stress relaxation layer comprises a polymer material.

4. The semiconductor device of claim 3, wherein said core metal comprises copper.

5. The semiconductor device of claim 1, wherein said conductive fill material comprises a core metal and at least one barrier layer.

6. The semiconductor device of claim 1, wherein a material of said stress relaxation layer has a coefficient of thermal expansion that is less than a coefficient of thermal expansion of said conductive fill material.

7. The semiconductor device of claim 1, further comprising a stress accommodation volume positioned in said substrate adjacent to said through hole via, said stress accommodation volume comprising a plurality of substantially empty volumes separated from said through hold via by a portion of said substrate.

8. The semiconductor device of claim 7, wherein said at least one volume expansion area comprises a resilient material.

9. A method of forming a through hole via in a semiconductor device, the method comprising:
forming an opening in a substrate of said semiconductor device, said opening comprising a plurality first spaced-apart opening portions and a plurality of respective second spaced-apart opening portions formed between and connecting each of said plurality of first spaced-apart opening portions, wherein each of said plurality of first spaced-apart opening portions has an extended lateral width that is greater than a lateral width of each of said respective second spaced-apart opening portions formed therebetween;
forming a stress relaxation layer above sidewalls of said opening; and
forming a metal-containing material in said opening after forming said stress relaxation layer.

10. The method of claim 9, wherein said metal-containing material is formed with a substantially constant lateral width in each of said pluralities of first and second spaced-apart opening portions.

11. The method of claim 9, wherein forming said stress relaxation layer comprises forming a resilient material in said opening, forming a second opening in said resilient material that extends through each of said pluralities of first and second spaced-apart opening portions, and thereafter forming said metal-containing material in said second opening.

12. The method of claim 9, further comprising removing a portion of said substrate from a rear side thereof so as to expose a surface of said metal-containing material.

13. A method, comprising:
forming a through hole via in a substrate of a semiconductor device, said through hole via comprising a fill metal and an insulating layer between said fill metal and said substrate; and
forming a stress relaxation mechanism operatively connected to said through hole via, said stress relaxation mechanism reducing a thermally induced stress in said semiconductor device that is caused by a mismatch of coefficients of thermal expansion of said substrate and said fill metal, wherein forming said stress relaxation mechanism comprises forming a stress relaxation layer in a through hole via opening after lining said through hole via opening with said insulating layer and prior to filling said through hole via opening with said fill metal.

14. The method of claim 13, wherein forming said stress relaxation mechanism comprises providing a stress accommodation volume adjacent to said through hole via.

15. The method of claim 14, wherein providing said stress accommodation volume comprises forming one or more substantially empty volumes in said substrate so that a portion of said substrate is positioned between said one or more substantially empty volumes and said through hole via.

16. The method of claim 13, wherein forming said stress relaxation mechanism comprises providing a stress accommodation volume in said through hole via.

17. The method of claim 16, wherein providing said stress accommodation volume comprises forming a plurality of spaced-apart expansion portions in said through hole via opening, wherein a lateral width of each of said plurality of spaced-apart expansion portions is greater than a lateral width of each of a plurality of respective through hole via connecting portions positioned between and connecting said each of said plurality of spaced-apart expansion portions.

18. A semiconductor device, comprising:
a substrate having a front side and a rear side;
a through hole via formed in said substrate so as to extend at least to said rear side, said through hole via comprising a dielectric layer formed in contact with said substrate and a metal-containing conductive fill material; and
a stress relaxation mechanism that is adapted to reduce thermally induced stress caused by a mismatch of coefficients of thermal expansion between said substrate and said conductive fill material, said stress relaxation mechanism comprising at least one volume expansion area that is provided as a locally wider portion of said through hole via having a locally increased lateral width that is greater than a lateral width of adjacent portions of said through hole via, wherein a lateral width of said metal-containing conductive fill material in said locally wider portion is substantially the same as a lateral width of said metal-containing conductive fill material in said adjacent portions.

19. The semiconductor device of claim 18, wherein said conductive fill material comprises a core metal and at least one barrier layer.

20. The semiconductor device of claim 19, wherein said core metal comprises copper.

21. The semiconductor device of claim 18, further comprising a stress accommodation volume positioned in said substrate adjacent to said through hole via, said stress accommodation volume comprising at least one substantially empty volume separated from said through hold via by a portion of said substrate.

* * * * *